(12) United States Patent
Lee

(10) Patent No.: US 8,110,426 B2
(45) Date of Patent: Feb. 7, 2012

(54) CMOS IMAGE SENSOR

(75) Inventor: Nan-Yi Lee, Chungcheongbuk-do (KR)

(73) Assignee: Intellectual Ventures II LLC, Wilmington, DE (US)

(*) Notice: Subject to any disclaimer, the term of this patent is extended or adjusted under 35 U.S.C. 154(b) by 0 days.

(21) Appl. No.: 12/648,008

(22) Filed: Dec. 28, 2009

(65) Prior Publication Data

US 2010/0197067 A1 Aug. 5, 2010

Related U.S. Application Data

(62) Division of application No. 11/643,368, filed on Dec. 20, 2006, now Pat. No. 7,663,194, which is a division of application No. 11/126,861, filed on May 10, 2005, now abandoned.

(51) Int. Cl.
*H01L 29/72* (2006.01)
(52) U.S. Cl. ............... 438/66; 438/73; 438/81
(58) Field of Classification Search .......... 438/66, 438/73, 81
See application file for complete search history.

(56) References Cited

U.S. PATENT DOCUMENTS

| 7,030,357 B2 | 4/2006 | Lee | |
|---|---|---|---|
| 2004/0113151 A1* | 6/2004 | Sekine | 257/72 |
| 2006/0146158 A1 | 7/2006 | Toros et al. | |

* cited by examiner

*Primary Examiner* — Edward Wojciechowicz
(74) *Attorney, Agent, or Firm* — McAndrews, Held & Malloy, Ltd.

(57) ABSTRACT

A pixel of a complementary metal oxide semiconductor (CMOS) image sensor includes a plurality of photodiodes for sensing light to thereby generate photoelectric charges in different regions; a plurality of transfer transistors for transferring photoelectric charges of corresponding photodiodes in response to a first control signal; a floating diffusion region for receiving photoelectric charges transferred by the plurality of transfer transistors; a rest transistor connected between a power supply voltage and the floating diffusion region for resetting the floating diffusion region by controlling a voltage loaded on the floating diffusion region in response to a second control signal; a drive transistor connected between the power supply voltage and the floating diffusion region to serve as a source follower buffer amplifier; and a select transistor connected between the drive transistor and a pixel output terminal for performing an addressing operation in response to a third control signal.

24 Claims, 4 Drawing Sheets

CMOS IMAGE SENSOR

CROSS-REFERENCE TO RELATED APPLICATIONS/INCORPORATION BY REFERENCE

The present patent application is a Divisional of application Ser. No. 11/643,368, filed Dec. 20, 2006 now U.S. Pat. No. 7,663,1994, which is a Divisional of application Ser. No. 11/126,861, filed May 10, 2005 now abandoned. The present patent application incorporates both of the above identified applications by reference in their entirety.

FIELD OF INVENTION

The present invention relates to a complementary metal oxide semiconductor (CMOS) image sensor; and, more particularly, to a CMOS image sensor for improving a light sensing ability by increasing a photodiode region included in a pixel with a reduced pixel size.

DESCRIPTION OF PRIOR ART

Generally, an image sensor is a semiconductor device for converting an optical image into an electrical signal. Charge coupled device (CCD) is a kind of the image sensor.

However, the CCD has several problems. For instance, a power consumption of the CCD is high and an operating method of the CCD is complex. Further, a manufacturing process for manufacturing the CCD is complicated since the manufacturing process includes many masking process steps, and it is hard to integrate a signal processing chip into the CCD.

Therefore, a complementary metal oxide semiconductor (CMOS) image sensor has been developed for overcoming the above-mentioned problems of the CCD.

In case of the CMOS image sensor, an image is generated by detecting data outputted from unit pixels included in the CMOS image sensor in sequence through a switching operation. Each unit pixel included in the CMOS image sensor includes a photodiode and MOS transistors.

Since the CMOS image sensor is manufactured by using a CMOS manufacturing technology, a power consumption of the CMOS image sensor is low and a manufacturing process of the CMOS image sensor having about 20 masking process steps is simpler than that of the CCD having about 30 to 40 masking process steps. Further, it is easy to integrate the CMOS image sensor into another signal processing chip.

FIG. 1A is a schematic circuit diagram depicting a unit pixel included in a conventional CMOS image sensor.

As shown, the unit pixel includes a photodiode PD 100, a transfer transistor Tx 101, a reset transistor Rx 103, a drive transistor Dx 104, and a select transistor Sx 105.

The photodiode PD 100 senses light to generate a photoelectric charge. The transfer transistor Tx 101 transfers the photoelectric charge generated by the photodiode PD 100 to a floating diffusion region FD 102. The reset transistor Rx 103 controls a voltage loaded on the floating diffusion region FD 102 to thereby reset the floating diffusion region FD 102.

The drive transistor Dx 104 is operated as a source follower buffer amplifier and the select transistor Sx 105 is operated as a switch to perform an addressing operation.

A load transistor 106 is formed outside the unit pixel to thereby read an output signal.

FIG. 1B is a diagram showing a layout of a photodiode and MOS transistors included in the unit pixel shown in FIG. 1.

As shown, an isolation region for forming an active region and a gate conductive layer is formed, wherein a photodiode 100 and a diffusion region 102 are formed in the active region and each gate of the MOS transistors is formed in the gate conductive layer. The photodiode 100 is shaped as a square and a gate of a transfer transistor 101 is connected to one side of the photodiode 100.

The floating diffusion region 102 is connected to one side of the gate of the transfer transistor 101. The floating diffusion region 102 is bended from a Y-axis direction to an X-axis direction to be connected to one side of a gate of a reset transistor 103.

The other side of the gate of the reset transistor 103 is connected to a drain region 107. The drain region 107 is bended from an X-axis direction to a Y-axis direction to be connected to one side of a gate of a drive transistor 104.

A source/drain region 108 is formed between the other side of the gate of the drive transistor 104 and one side of a gate of a select transistor 105. Another source drain/drain region 109 is formed to the other side of the gate of the select transistor 105.

The floating diffusion region 102 is formed on an active region between each gate of the transfer transistor 101 and the reset transistor 103. The floating diffusion region 102 is electrically connected to the gate of the drive transistor 104 through a contact and a connect wire.

Operations of the conventional CMOS image sensor are described below.

(a) The photodiode PD is reset by turning on the transfer transistor Tx and the reset transistor Rx.

(b) The transfer transistor Tx, the reset transistor Rx and the select transistor Sx are turned off Herein, the photodiode is in a fully depletion state.

(c) A photoelectric charge is integrated into the photodiode PD.

(d) The floating region FD is reset by turning on the reset transistor Rx after an appropriate integration time is passed.

(e) A required unit pixel is addressed by turning on the select transistor Sx.

(f) A first output voltage V1 outputted from the drive transistor Dx is measured, wherein the output voltage V1 indicates a direct current (DC) level shift of the floating diffusion region FD.

(g) The transfer transistor Tx is turned on. Herein, all the photoelectric charges integrated in the photodiode PD is transferred to the floating diffusion region FD.

(h) The transfer transistor Tx is turned off.

(i) A second output voltage V2 outputted from the drive transistor Dx is measured.

(j) A voltage difference between the first output voltage V1 and the second output voltage V2 is generated. The output signal (V1−V2) is generated as a result of the transference of the photoelectric charges and is a pure image signal value not having a noise.

The first output voltage V1 includes a noise and the second output voltage V2 includes both of a noise and an image signal. Thus, the pure image signal is obtained by subtracting the first output voltage V1 from the second output voltage V2. This method is generally called a correlated double sampling (CDS). The CDS is generally applied to the conventional CMOS image sensor.

Meanwhile, enough unit pixels are required to be included in the conventional CMOS image sensor and a photodiode included in each unit pixel requires an enough region.

However, as above-mentioned, since a unit pixel included in the conventional CMOS image sensor includes a photodiode and four MOS transistors, it is hard to reduce a size of the conventional CMOS image sensor satisfying the enough number of unit pixels and the enough region of a photodiode.

SUMMARY OF INVENTION

It is, therefore, an object of the present invention to provide a complementary metal oxide semiconductor (CMOS) image sensor capable of securing enough number of unit pixels and an enough photodiode region with a reduced size.

In accordance with an aspect of the present invention, there is provided a pixel of a CMOS image sensor including a plurality of photodiodes for sensing light to thereby generate photoelectric charges in different regions; a plurality of transfer transistors for transferring photoelectric charges of corresponding photodiodes in response to a first control signal; a floating diffusion region for receiving photoelectric charges transferred by the plurality of transfer transistors; a rest transistor connected between a power supply voltage and the floating diffusion region for resetting the floating diffusion region by controlling a voltage loaded on the floating diffusion region in response to a second control signal; a drive transistor connected between the power supply voltage and the floating diffusion region to serve as a source follower buffer amplifier; and a select transistor connected between the drive transistor and a pixel output terminal for performing an addressing operation in response to a third control signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a complementary metal oxide semiconductor (CMOS) image sensor in accordance with the present invention will be described in detail referring to the accompanying drawings.

Figure 1A:
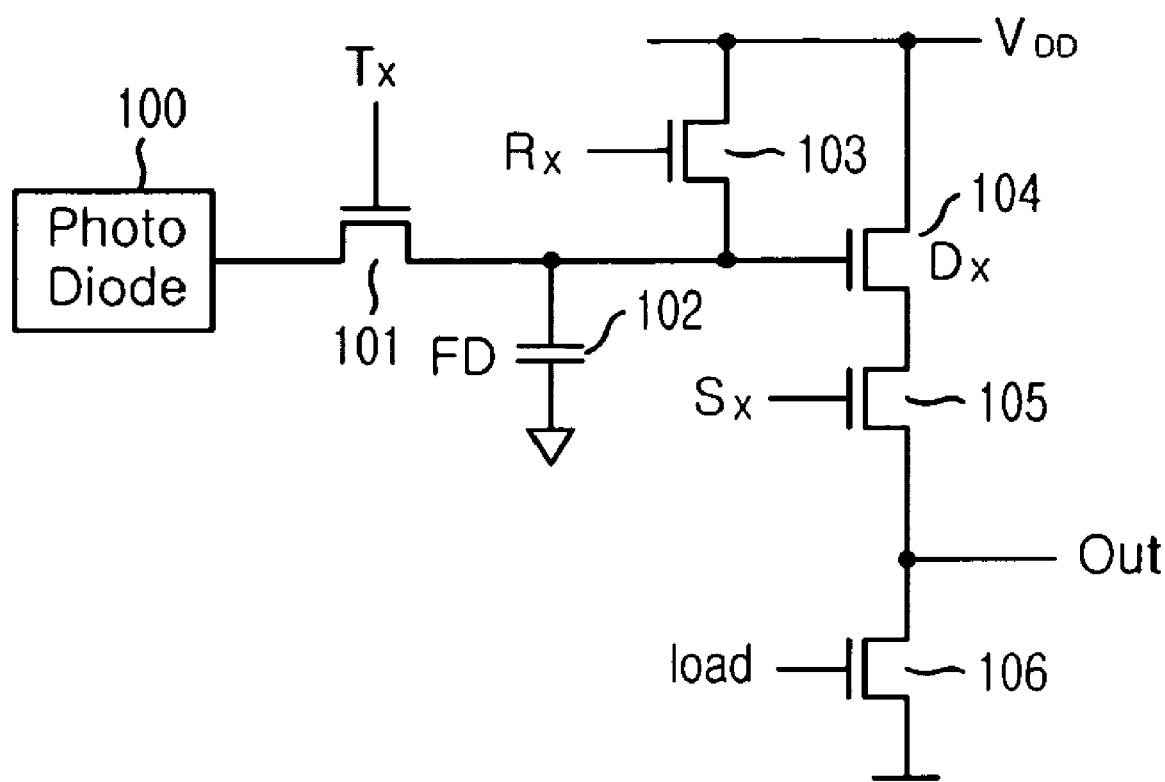
FIG. 1A is a schematic circuit diagram depicting a unit pixel included in a conventional CMOS image sensor.
Figure 1B:
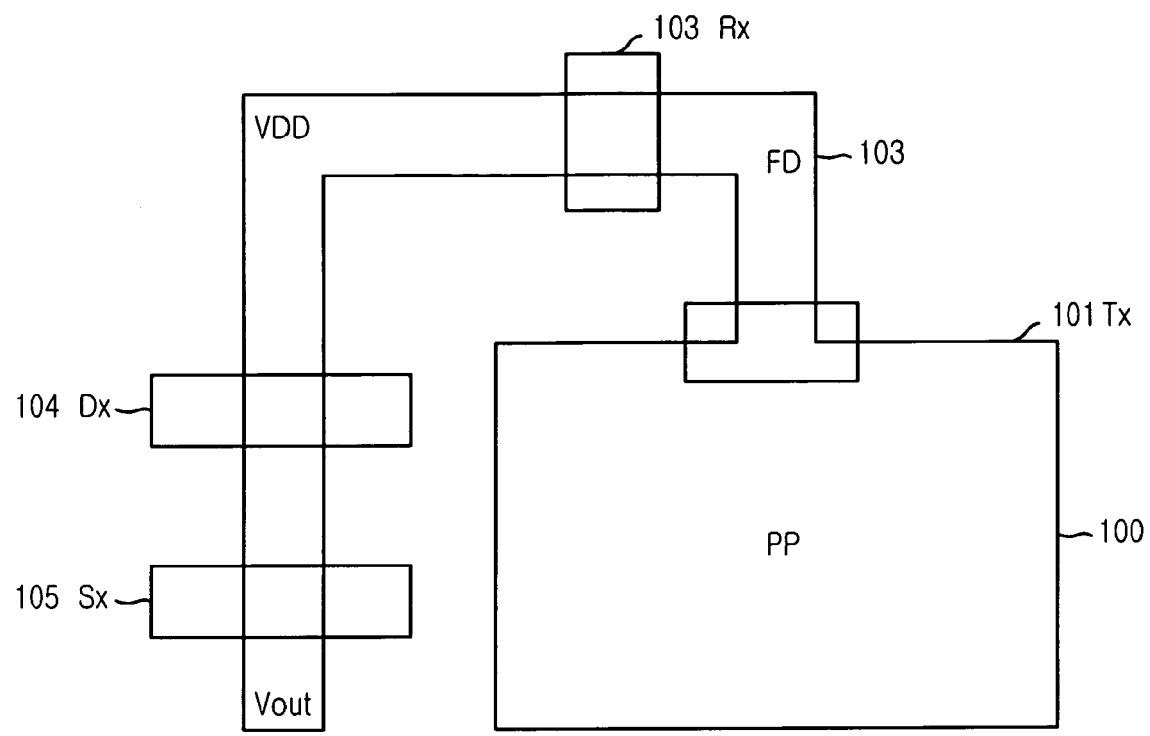
FIG. 1B is a diagram showing a layout of a photodiode and MOS transistors included in the unit pixel shown in FIG. 1.
Figure 2A:
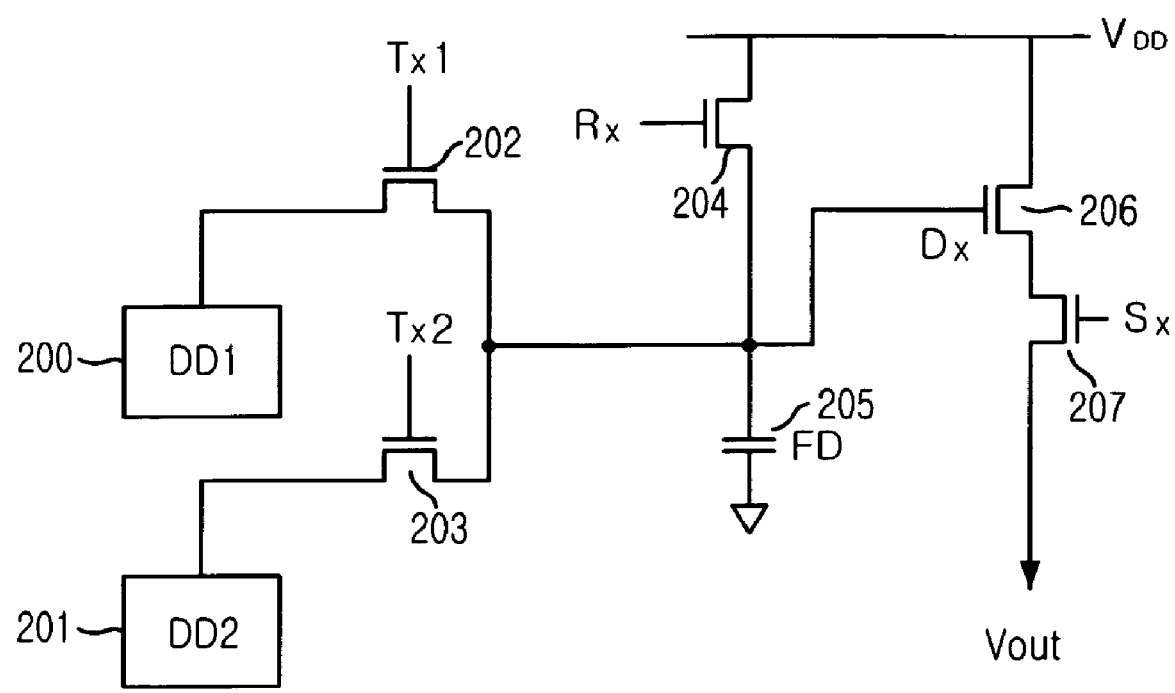
FIG. 2A is a schematic circuit diagram showing a pixel structure of a CMOS image sensor in accordance with a preferred embodiment of the present invention.

FIG. 2A is a schematic circuit diagram showing a pixel structure of a CMOS image sensor in accordance with a preferred embodiment of the present invention.

As shown, two photodiodes, i.e., a first photo diode PD1 and a second photodiode PD2, share a floating diffusion region FD, a reset transistor Rx, a drive transistor Dx and a select transistor Sx. That is, a unit pixel serves as two pixels.

Referring to FIG. 2A, the CMOS image sensor includes a first photodiode 200, a second photodiode 201, a first transfer transistor 202, a second transfer transistor 203, a reset transistor 204, a floating diffusion region 205, a drive transistor 206 and a select transistor 207.

The first and the second photodiodes 200 and 201 sense light to thereby generate photoelectric charges in different regions. The first transfer transistor 202 transfers photoelectric charges generated by the first photodiode 200 in response to a first transferring control signal Tx1. Likewise, the second transfer transistor 203 transfers photoelectric charges generated by the second photodiode 201 in response to a second transferring control signal Tx2.

The floating diffusion region 205 receives the photoelectric charges transferred by the first and the second transfer transistors 202 and 203.

The reset transistor 204 controls a voltage loaded on the floating diffusion region 205 to thereby reset the floating diffusion region 205. Herein, a drain of the reset transistor 204 is coupled to a power supply voltage VDD and a source of the reset transistor 204 is connected to the floating diffusion region 205.

The drive transistor 205 serves as a source follower buffer amplifier. Herein, a source of the drive transistor 205 is coupled to the power supply voltage VDD and a gate of the drive transistor 205 is connected to the floating diffusion region 205.

The select transistor 207 is connected between the drive transistor 206 and a pixel output terminal Vout. The select transistor 207 is operated as a switch to perform an addressing operation in response to a select control signal Sx.

Operations of the above-mentioned CMOS image sensor are described below.

(1) The first and the second photodiodes 200 and 201 are reset by turning on the first and the second transfer transistors 202 and 203 respectively.

(2) The first transfer transistor 202, the second transfer transistor 203, the reset transistor 204 and select transistor 207 are turned off. Herein, the first and the second photodiodes 200 and 201 are in a fully depletion state.

(3) Photoelectric charges are integrated into the first and the second photodiodes 200 and 201.

(4) The floating region 205 is reset by turning on the reset transistor 204 after an appropriate integration time is passed.

(5) A required unit pixel is addressed by turning on the select transistor 207.

(6) A first output voltage V1 outputted from the drive transistor 206 is measured, wherein the output voltage V1 indicates a direct current (DC) level shift of the floating diffusion region 205.

(7) The first transfer transistor 202 is turned on. Herein, all the photoelectric charges integrated in the first photodiode 200 are transferred to the floating diffusion region 205.

(8) The first transfer transistor 202 is turned off.

(9) A second output voltage V2 outputted from the drive transistor 206 is measured.

(10) A voltage difference between the first output voltage V1 and the second output voltage V2 is generated. The output signal (V1−V2) is a pure image signal value generated from photoelectric charges integrated in the first photodiode 200.

(11) The floating diffusion region 205 is reset by turning on the reset transistor 204.

(12) The required unit pixel is addressed by turning on the select transistor 207.

(13) A third output voltage V3 outputted from the drive transistor 206 is measured.

(14) The second transfer transistor 203 is turned on. Herein, all the photoelectric charges integrated in the second photodiode 201 are transferred to the floating diffusion region 205.

(15) The second transfer transistor 203 is turned off.

(16) The fourth output voltage V4 outputted from the drive transistor 206 is measured.

(17) A voltage difference between the third output voltage V3 and the fourth output voltage V4 is generated. The output signal (V3–V4) is a pure image signal value generated from photoelectric charges integrated in the second photodiode 201.

Figure 2B:
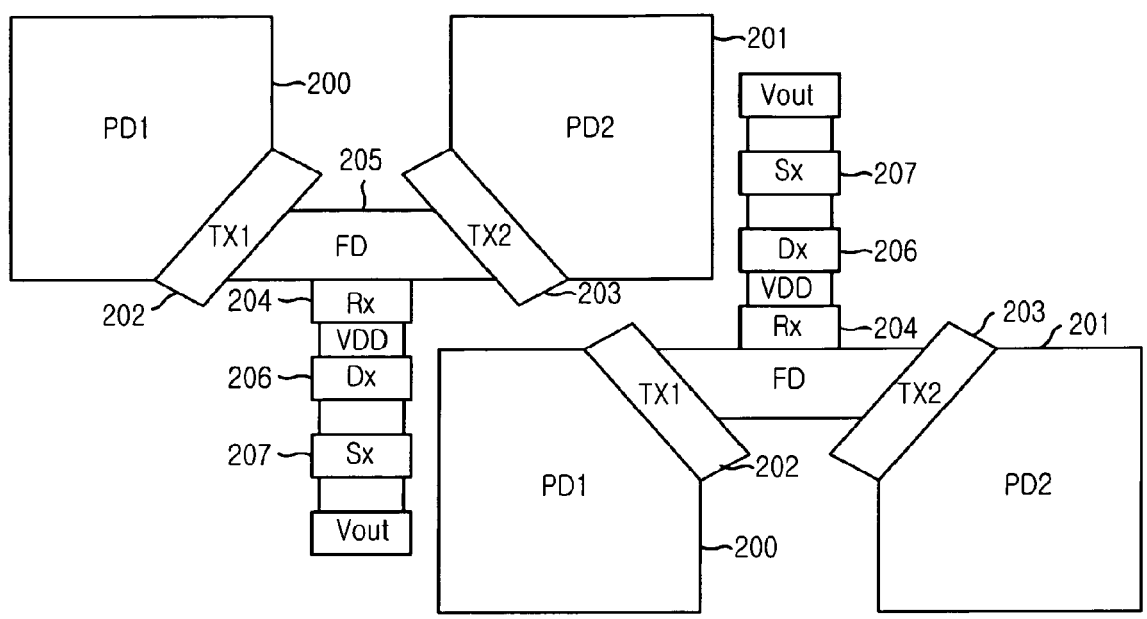
FIG. 2B is a diagram showing a layout of unit pixels in accordance with the preferred embodiment of the present invention.

FIG. 2B is a diagram showing a layout of two unit pixels in accordance with the preferred embodiment of the present invention.

As shown, an active region for forming a photodiode and diffusion region of each MOS transistors is laid out as a "T" shape. The first and the second photodiodes 200 and 201 are separately formed on an active region of a head of the "T" shape.

On the lower active region of the "T" shape, the floating diffusion region 205, the reset transistor 204, the drive transistor 206 and the select transistor 207 are formed.

On an edge portion of the first photodiode 200, the first transfer transistor 202 is formed. Likewise, on an edge portion of the second photodiode 201, the second transfer transistor 203 is formed.

Meanwhile, unit pixels are laid out such that one unit pixel is formed upside down in comparison with a neighboring unit pixel so that the unit pixels engage each other as shown in FIG. 2B. Therefore, a size of the CMOS image sensor can be reduced.

Although the above-mentioned embodiment of the present invention describes a unit pixel including four transistors, i.e., a transfer transistor, a reset transistor, a drive transistor and a select transistor, the present invention can be applied to another unit pixel including a photodiode, a floating diffusion region and a transfer gate formed between the photodiode and the floating diffusion region. That is, the present invention can be applied to any image sensor, wherein a plurality of photodiode share one floating diffusion region through corresponding transfer transistors.

Therefore, in accordance with the present invention, since a plurality of photodiodes share one floating diffusion region, the number of reset transistors, drive transistors, and select transistors can be reduced. Accordingly, a size of an image sensor can be reduced and the number of dies per one wafer can be increased.

Further, a fixed pattern noise can be eliminated because of the reduction of the number of MOS transistors and the sharing method. Also, a light sensing ability is increased since enough area for a photodiode region can be secured.

While the present invention has been described with respect to the particular embodiments, it will be apparent to those skilled in the art that various changes and modifications may be made without departing from the spirit and scope of the invention as defined in the following claims.

What is claimed is:

1. A method, comprising:
   forming a first row of "T"-shaped active regions that each include a head portion and a base portion;
   forming a second row of "T"-shaped active regions that each include a head portion and a base portion;
   forming, in each head portion, a floating diffusion region, a plurality of photodiodes, and a plurality of transfer transistors configured to couple respective photodiodes to the floating diffusion region; and
   forming, in each base portion, a reset transistor, a select transistor, and a drive transistor;
   wherein said forming a second row of "T"-shaped active regions includes extending at least one base portion from the second row into the first row and positioning the at least one base portion from the second row between neighboring head portions from the first row.

2. The method of claim 1, wherein said forming a first row of "T"-shaped active regions comprises:
   extending at least one base portion from the first row into the second row and positioning the at least one base portion from the first row between neighboring head portions from the second row.

3. The method of claim 1, wherein said forming a second row of "T"-shaped active regions comprises:
   forming the second row of "T"-shaped active regions such that the second row of "T"-shaped active regions is positioned upside down with respect to the first row of "T"-shaped active regions.

4. The method of claim 3, wherein said forming a second row of "T"-shaped active regions further comprises:
   positioning each "T"-shaped active region of the second row of "T"-shaped active regions between adjacent "T"-shaped active regions of the first row of "T"-shaped active regions.

5. The method of claim 1, wherein said forming a first row of "T"-shaped active regions comprises:
   forming each "T"-shaped active region to be symmetrical about an axis coincident with its respective base portion.

6. The method of claim 1, wherein:
   said forming a first row of "T"-shaped active regions and said forming a second row of "T"-shaped active regions comprises forming the head portion of each "T"-shaped active region to have a "U"-shape including a bottom portion, a first leg portion coupled to the bottom portion, and a second leg portion coupled to the bottom portion; and
   said forming, in each head portion, comprises:
      forming a first photodiode of the plurality of photodiodes in the first leg portion of each "U"-shaped head portion;
      forming a second photodiode of the plurality of photodiodes in the second leg portion of each "U"-shaped head portion; and
      forming the floating diffusion region in the bottom portion of each "U"-shaped head portion.

7. The method of claim 6, wherein said forming, in each head portion, further comprises:
   forming, in each "U"-shaped head portion, a first transfer transistor of the plurality of transistors between the first photodiode and the floating diffusion region and with a diagonal orientation with respect to its first leg portion and its bottom portion; and
   forming, in each "U"-shaped head portion, a second transfer transistor of the plurality of transistors between the second photodiode and the floating diffusion region and with a diagonal orientation with respect to its second leg portion and its other base portion.

8. A method, comprising:
   forming a first linear arrangement of "T"-shaped unit pixels including a plurality of photoelectric sensing devices and a floating diffusion region coupled to the plurality of photoelectric sensing devices; and
   forming a second linear arrangement of "T"-shaped unit pixels including a plurality of photoelectric sensing devices and a floating diffusion region coupled to the plurality of photoelectric sensing devices;
   wherein said forming a second linear arrangement of "T"-shaped unit pixels includes positioning the second linear arrangement of "T"-shaped unit pixels such that a portion of at least one "T"-shaped unit pixel from the second linear arrangement of "T"-shaped unit pixels extends into the first linear arrangement of "T"-shaped unit pixels and lies between photoelectric sensing devices of neighboring "T" shaped unit pixels from the first linear arrangement of "T"-shaped unit pixels.

9. The method of claim 8, wherein said forming a first linear arrangement of "T"-shaped unit pixels and said forming a second linear arrangement of "T"-shaped unit pixels comprise:
  forming a first photoelectric sensing device and a second photoelectric sensing device of the plurality of photoelectric sensing devices in a head portion of each "T"-shaped unit pixel;
  forming the floating diffusion region in the head portion of each "T"-shaped unit pixel;
  forming a first transfer transistor between the first photoelectric sensing device and the floating diffusion region of each "T"-shaped unit pixel; and
  forming a second transfer transistor between the second photoelectric sensing device and the floating diffusion region of each "T"-shaped unit pixel.

10. The method of claim 9, wherein said forming a first linear arrangement of "T"-shaped unit pixels and said forming a second linear arrangement of "T"-shaped unit pixels further comprise:
  forming a reset transistor, a drive transistor, and a select transistor in a base portion of each "T"-shaped unit pixel.

11. The method of claim 8, wherein said forming a first linear arrangement of "T"-shaped unit pixels comprises:
  forming the first linear arrangement of "T"-shaped unit pixels such that the first linear arrangement of "T"-shaped unit pixels is positioned upside down with respect to the second linear arrangement of "T"-shaped unit pixels.

12. The method of claim 8, wherein said forming a first linear arrangement of "T"-shaped unit pixels comprises:
  positioning each "T"-shaped unit pixel of the first linear arrangement of "T"-shaped unit pixels such that at least a portion of at least one "T"-shaped unit pixel from the first linear arrangement of "T"-shaped unit pixels extends into the second linear arrangement of "T"-shaped unit pixels and between adjacent "T"-shaped unit pixels of the second linear arrangement of "T"-shaped unit pixels.

13. The method of claim 10, wherein said forming a first linear arrangement of "T"-shaped unit pixels and said forming a second linear arrangement of "T"-shaped unit pixels further comprise:
  forming each "T"-shaped unit pixel to be symmetrical about an axis coincident with its respective base portion.

14. The method of claim 8, wherein said forming a first linear arrangement of "T"-shaped unit pixels and said forming a second linear arrangement of "T"-shaped unit pixels further comprise:
  forming a head portion of each "T"-shaped unit pixel to have a "U" shape including a bottom portion, a first leg portion coupled to the bottom portion, and a second leg portion coupled to the bottom portion;
  forming a first photoelectric sensing device from the plurality of photoelectric sensing devices in the first leg portion of each "U"-shaped head portion;
  forming a second photoelectric sensing device from the plurality of photoelectric sensing devices in the second leg portion of each "U"-shaped head portion; and
  forming the floating diffusion region in the bottom portion of each "U"-shaped head portion.

15. The method of claim 14, wherein said forming a first linear arrangement of "T"-shaped unit pixels and said forming a second linear arrangement of "T"-shaped unit pixels further comprise:
  forming, in each "U"-shaped head portion, a first transfer transistor between the first photoelectric sensing device and the floating diffusion region and with a diagonal orientation with respect to its first leg portion and its bottom portion; and
  forming, in each "U"-shaped head portion, a second transfer transistor between the second photoelectric sensing device and the floating diffusion region and with a diagonal orientation with respect to its second leg portion and its bottom portion.

16. A method, comprising:
  forming a first plurality of unit pixels such that each unit pixel comprises:
    a head portion including a plurality of photoelectric sensing devices; and
    a linear base portion including a plurality of transistors and extended from the head portion in a first direction away from its respective head portion; and
  forming a second plurality of unit pixels such that each unit pixel comprises:
    a head portion including a plurality of photoelectric sensing devices; and
    a linear base portion including a plurality of transistors and extended from the head portion in a second direction away from its respective head portion and opposite the first direction.

17. The method of claim 16, wherein said forming a first plurality of unit pixels and said forming a second plurality of unit pixels further comprise:
  forming a first photoelectric sensing device and a second photoelectric sensing device of the plurality of photoelectric sensing devices in the head portion of each unit pixel;
  forming a floating diffusion region in the head portion of each unit pixel;
  forming a first transfer transistor between the first photoelectric sensing device and the floating diffusion region of each unit pixel; and
  forming a second transfer transistor between the second photoelectric sensing device and the floating diffusion region of each unit pixel.

18. The method of claim 17, wherein said forming a first plurality of unit pixels and said forming a second plurality of unit pixels further comprise:
  forming a reset transistor, a drive transistor, and a select transistor of the plurality of transistors in the base portion of each unit pixel.

19. The method of claim 16, wherein said forming a first plurality of unit pixels and said forming a second plurality of unit pixels further comprise:
  positioning each unit pixel of the first plurality of unit pixels such that the base portion of each unit pixel of the first plurality of unit pixels lies between adjacent unit pixels of the second plurality of unit pixels.

20. The method of claim 16, wherein said forming a first plurality of unit pixels and said forming a second plurality of unit pixels further comprise:
  positioning the first plurality of unit pixels and the second plurality of unit pixels such that the first plurality of unit pixels and the second plurality of unit pixels each have a linear arrangement and the base portion of each unit pixel of the first plurality of unit pixels extends into the linear arrangement of the second plurality of unit pixels.

21. The method of claim 16, wherein said forming a first plurality of unit pixels and said forming a second plurality of unit pixels further comprise:

forming each unit pixel to be symmetrical about an axis coincident with its respective base portion.

22. The method of claim 16, wherein said forming a first plurality of unit pixels and said forming a second plurality of unit pixels further comprise:

forming the head portion of each unit pixel to have a "U" shape including a bottom portion, a first leg portion coupled to the bottom portion, and a second leg portion coupled to the bottom portion;

forming a first photoelectric sensing device from the plurality of photoelectric sensing devices in the first leg portion of each unit pixel;

forming a second photoelectric sensing device from the plurality of photoelectric sensing devices in the second leg portion of each unit pixel; and forming the floating diffusion region in the bottom portion of each unit pixel.

23. The method of claim 22, wherein said forming a first plurality of unit pixels and said forming a second plurality of unit pixels further comprise:

forming, in each unit pixel, a first transfer transistor between the first photoelectric sensing device and the floating diffusion region and with a diagonal orientation with respect to its first leg portion and its bottom portion; and forming, in each unit pixel, a second transfer transistor between the second photodiode and the floating diffusion region and with a diagonal orientation with respect to its second leg portion and its bottom portion.

24. The method of claim 16, wherein said forming a first plurality of unit pixels comprises:

positioning a base portion of a unit pixel from the first plurality of unit pixels between neighboring photoelectric sensing devices from the second plurality of unit pixels.

* * * * *

UNITED STATES PATENT AND TRADEMARK OFFICE
CERTIFICATE OF CORRECTION

| | | |
|---|---|---|
| PATENT NO. | : 8,110,426 B2 | Page 1 of 1 |
| APPLICATION NO. | : 12/648008 | |
| DATED | : February 7, 2012 | |
| INVENTOR(S) | : Lee | |

It is certified that error appears in the above-identified patent and that said Letters Patent is hereby corrected as shown below:

Column 1, line 9, delete "No. 7,663,1994," and insert -- No. 7,663,194, --.

Column 6, line 66, in Claim 8, delete ""T" shaped" and insert -- "T"-shaped --.

Signed and Sealed this
Twenty-eighth Day of August, 2012

David J. Kappos
*Director of the United States Patent and Trademark Office*